United States Patent
Singh et al.

(10) Patent No.: US 11,139,664 B2
(45) Date of Patent: Oct. 5, 2021

(54) BATTERY PROTECTOR HIBERNATE INPUT SEPARATE FROM $V_{DD}$, LOW POWER OUTPUT

(71) Applicant: TEXAS INSTRUMENTS INCORPORATED, Dallas, TX (US)

(72) Inventors: Abhijeet Kumar Singh, Karnataka (IN); Manish Parmar, Karnataka (IN); Dipankar Mitra, Karnataka (IN); Vv Shyam Prasad, Karnataka (IN); Mahesh Kv, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 403 days.

(21) Appl. No.: 16/127,963

(22) Filed: Sep. 11, 2018

(65) Prior Publication Data
US 2020/0083725 A1 Mar. 12, 2020

(51) Int. Cl.
*H02J 7/00* (2006.01)
*H01M 10/48* (2006.01)
*G01R 31/382* (2019.01)

(52) U.S. Cl.
CPC .......... *H02J 7/0036* (2013.01); *G01R 31/382* (2019.01); *H01M 10/482* (2013.01); *H02J 7/0026* (2013.01); *H02J 7/0068* (2013.01)

(58) Field of Classification Search
CPC ...... H02J 7/0031; H02J 7/0036; H02J 7/0026; H02J 7/0068; H02J 7/0029; H02J 7/00306; H02J 7/0032; G01R 31/382; H01M 10/482

USPC ......................................................... 320/136
See application file for complete search history.

(56) References Cited

U.S. PATENT DOCUMENTS

| | | | | |
|---|---|---|---|---|
| 2003/0080747 A1* | 5/2003 | Huelss | ............. | G01R 19/16528 324/426 |
| 2007/0210759 A1* | 9/2007 | Sano | ...................... | H02J 7/0031 320/134 |
| 2007/0241734 A1* | 10/2007 | Stoicescu | ............ | H01M 10/482 323/304 |
| 2009/0302802 A1* | 12/2009 | Miyazaki | ................ | B60L 53/11 320/116 |
| 2011/0101918 A1* | 5/2011 | Tsukamoto | ........... | H02J 7/0021 320/118 |

(Continued)

*Primary Examiner* — Nathaniel R Pelton
*Assistant Examiner* — Mohammed J Sharief
(74) *Attorney, Agent, or Firm* — Ray A. King; Charles A. Brill; Frank D. Cimino (57) ABSTRACT

A battery protector includes analog frontend circuitry coupled to a hibernate mode input terminal that is one of configured to couple to a high voltage connector terminal when the system is connected to an external load or charger to define an active mode and configured to float when the system is disconnected from the external load or charger to define a hibernate mode. The analog frontend circuitry is configured to provide a signal at an output thereof to distinguish, in the absence of an external ground connection, between connected and floating conditions for the hibernate mode input terminal. Digital logic is coupled with the output of the analog frontend circuitry, the digital logic providing a digital signal to control whether the battery protector is operating in the active mode or the hibernate mode based on the signal at the output of the analog frontend circuitry.

21 Claims, 7 Drawing Sheets

(56) References Cited

U.S. PATENT DOCUMENTS

| | | | | |
|---|---|---|---|---|
| 2012/0203178 A1* | 8/2012 | Tverskoy | ............... | H02J 7/0031 604/151 |
| 2013/0033233 A1* | 2/2013 | Noda | .................... | H02J 7/0063 320/134 |
| 2013/0200847 A1* | 8/2013 | Kurokawa | ............ | H02J 7/0029 320/112 |
| 2013/0289539 A1* | 10/2013 | Sarkinen | ................. | H02M 3/07 604/891.1 |
| 2015/0022926 A1* | 1/2015 | Toivola | ..................... | G06F 1/26 361/92 |
| 2016/0344205 A1* | 11/2016 | Abe | ..................... | H01M 10/425 |
| 2018/0152035 A1* | 5/2018 | Li | ....................... | H01M 10/482 |
| 2018/0294664 A1* | 10/2018 | Hong | ....................... | H02H 7/18 |
| 2019/0181665 A1* | 6/2019 | Shibata | ............... | H02J 7/00308 |
| 2019/0253289 A1* | 8/2019 | Shu | ......................... | H04J 3/047 |

* cited by examiner

BATTERY PROTECTOR HIBERNATE INPUT SEPARATE FROM $V_{DD}$, LOW POWER OUTPUT

TECHNICAL FIELD

This disclosure relates to a hibernate mode for battery pack protection circuitry.

BACKGROUND

Battery protection circuitry is used to protect and extend the life of battery cells over a range of operating conditions. For example, some types of battery packs may be kept in storage for one or more years at a time, such as due to being shipped or due to not being used. Accordingly, protection circuitry may enter a hibernate (e.g., sleep or low power) mode to save power. Existing approaches tend to rely on commands from a host device to instruct protection circuitry to enter the hibernate mode. In a stacked configuration where multiple protector devices are used in a battery pack, each device uses its own undervoltage condition to enter the sleep mode.

SUMMARY

In one example, a battery system includes a battery protector including input terminals connected between high and low voltage rails of a battery pack. The battery protector includes analog frontend circuitry coupled to a hibernate mode input terminal that is one of configured to couple to a high voltage connector terminal when the system is connected to an external load or charger to define an active mode and configured to float when the system is disconnected from the external load or charger to define a hibernate mode. The analog frontend circuitry is configured to provide a signal at an output thereof to distinguish, in the absence of an external ground connection, between connected and floating conditions for the hibernate mode input terminal. Digital logic is coupled with the output of the analog frontend circuitry, the digital logic providing a digital signal to control whether the battery protector is operating in the active mode or the hibernate mode based on the signal at the output of the analog frontend circuitry. A low power output is configured to provide a signal within the battery protector that varies based on the digital signal to indicate whether the battery protector is operating in the active mode or the hibernate mode.

In another example, a method includes receiving, at a hibernate mode input of a battery protector, either a high voltage rail signal of a battery pack in response to a load or charger being connected or a floating signal in response to the load or charger being disconnected. The method also includes comparing the signal at the hibernate mode input to a reference signal to distinguish between connected and floating conditions for the battery protector in the absence of an external ground connection for the battery protector. The method also includes determining whether to operate the battery protector in an active mode or hibernate mode based on the comparison. The method also includes providing a digital signal that varies based on the determination to control whether the battery protector is operating in the active mode or the hibernate mode.

In yet another example, a battery system includes a plurality of battery cells connected between a high voltage rail and a low voltage rail of a battery pack. The system also includes a plurality of battery protectors in a stacked arrangement, in which a respective set of the battery cells are coupled to each of the battery protectors. Each of the battery protectors includes analog frontend circuitry, digital logic and a low power output. The analog frontend circuitry is coupled to a hibernate mode input of the respective battery protector. The analog frontend circuitry configured to provide an analog output signal to resolve between connected and floating conditions at the hibernate mode input thereof. The digital logic is configured to provide a digital signal to control whether the respective battery protector is operating in an active mode or a hibernate mode based on the analog output signal. The low power output is configured to provide a signal that varies based on the digital signal to indicate whether the battery protector is operating in the active mode or the hibernate mode. The hibernate mode input of one of the battery protectors is configured to connect to a high voltage connector terminal while the system is connected to an external load or charger and configured to float while the system is disconnected from the external load or charger. The hibernate mode input of each other battery protector is coupled to the low power output of a respective different one of the battery protectors.

DETAILED DESCRIPTION

This disclosure relates to an architecture and method to implement a hibernate mode for battery pack protection circuitry.

As an example, battery protection circuitry (also referred to herein as a battery protector) is connected between high and low voltage rails corresponding to the voltages across a set of one or more battery cells. The battery cells and one or more battery protectors can be implemented within a battery pack, such as to store electrical power for variety of applications (e.g., cordless tools or other electronic devices). The battery protector includes analog frontend circuitry that is configured to monitor a hibernate mode input of the battery protector. The analog frontend circuitry is configured to resolve the state of the hibernate mode input in the absence of the external ground connection, thereby determining whether or not the battery pack is connected to an external removable system (e.g., containing a load or charger). For example, the analog frontend circuitry can include a pull down device coupled with the hibernate mode input (e.g., a node) to pull the hibernate mode input to zero volts when the external system is disconnected. Thus, when the hibernate mode input is under a floating condition, the analog frontend circuitry pulls the hibernate mode input down (e.g., to approximately zero volts) at an input of a comparator. That way, the frontend circuitry may distinguish between the connected and floating conditions based on the state of the signal at the hibernate mode input and in the absence of the external ground connection.

In an example, the battery protector can implement deglitch filtering (e.g., digital filtering) of the comparator output signal. By implementing such deglitch filtering, erroneous transitions between the hibernate and active modes of operation can be reduced or eliminated. For example, different time windows for deglitch filtering can be implemented according to whether the battery protector is determined to be entering or exiting the hibernate mode. Digital logic is configured to control the battery protector to operate in the active or hibernate mode based on the filtered comparator signal. For example, in response to entering the hibernate mode, the digital logic can provide a control signal to turn off core circuitry in the battery pack (e.g., analog-to-digital converter (ADC) circuitry, cell voltage and temperature protection circuitry, cell balancing circuitry, power circuitry), except for the analog frontend circuitry and the associated digital logic which receives power and remains active whether in the active or hibernate mode.

In some examples, multiple battery protectors can be configured in a stacked arrangement within a given battery pack. In such example, the battery protectors can communicate via an internal link within the battery pack. For example, the first battery protector can include an output coupled to the hibernate input terminal of another battery protector in the stack. The first battery protector thus can distinguish between connected and disconnected states of the battery pack and provide a low power signal on the internal link to communicate a corresponding signal to indicate the detected condition to the hibernate mode input of other battery protector—whether the battery protector is in the active or hibernate mode.

In this way, each battery protector can minimize self discharge of its associated cells in the battery pack over a range of operating voltages. Additionally, as mentioned, the battery protector can operate in the presence of a floating battering pack when no ground connection exists. Further, regardless of the number of battery protectors implemented in the battery pack, only a single hibernate mode port to one battery protector is needed as communication to other battery protectors are implemented internally within the battery pack. The reduced self-discharge may further prolong the battery life as well as afford an increase in the storage time such that the user need not recharge the battery cells as frequently since loss capacity is minimized as well. Thus, while reducing the number of charging cycles, the life of the battery may also be increased.

Figure 1:
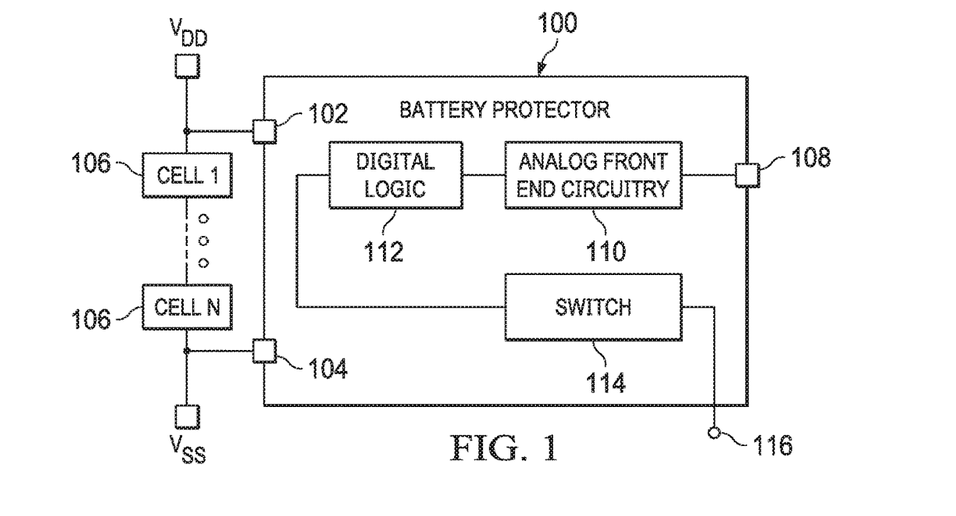
FIG. 1 illustrates an example of a battery protector.

FIG. 1 depicts an example of a battery protector 100 having input terminals 102 and 104 coupled between high and low voltage rails, demonstrated as $V_{DD}$ and $V_{SS}$. As part of a battery pack (see, e.g., FIGS. 2-3) containing the battery protector 100, one or more battery cells 106 are also connected between the terminals 102 and 104 to provide respective cell battery voltages (e.g., $V_{BATN}=V_N-V_{N-1}$) to be monitored by each respective protector. For example, each cell can be a lithium ion cell or other type of energy storage device. The battery protector 100 also includes a hibernate mode input terminal 108 that is to receive a signal indicative of the presence of an external system being connected to the battery protector or the absence thereof.

For example, the external system includes power terminals configured to connect to terminals associated with $V_{DD}$ and $V_{SS}$ and another terminal to connect the hibernate mode input terminal 108. While connected, the external system can electrically couple terminal 108 with $V_{DD}$ such as via a switch that is controlled by the external system and/or responsive to connecting the external system to the battery protector terminals 102, 104 and 108. When the external system is disconnected from the battery pack, the terminal 108 is under a floating condition.

The battery protector 100 includes analog frontend circuitry 110 having an input that is coupled to the hibernate mode terminal 108. Thus, the analog frontend circuitry 110 monitors the signal at the terminal 108. The analog frontend circuitry is configured to provide an output signal distinguishing, in the absence of an external ground connection, between connected and floating conditions for the hibernate mode input terminal 108. For example, the analog frontend circuitry 110 includes a low power pull down device (e.g., a current source) coupled with the terminal 108 to pull the terminal to a low voltage when in the floating condition. As disclosed herein, the terminal 108 is coupled to VDD when an external system is connected.

The battery protector 100 also include digital logic 112 coupled to the output of the analog frontend circuitry 110. The digital logic 112 is configured to resolve whether the external system is connected or disconnected with respect to the battery protector 100 based on the output from the analog frontend circuitry 110, which varies between a high and low voltage signal based on a signal received from the hibernate mode terminal 108. The digital logic 112 provides a state control signal, which is used to control entry into the hibernate mode as well as exit from the hibernate mode. The digital logic 112 thus provides a signal that can be utilized by associated logic to set the state of the battery protector. The digital logic 112 thus provides a digital control signal to define the operating mode.

The battery protector 100 further may include a switch device 114 that is coupled between an internal voltage rail and a switch output 116. The digital logic 112 is connected to control the switch device 114 depending upon whether the battery protector is determined to be operating in the active mode or the hibernate mode. For example, when operating in the active mode, the digital logic 112 controls the switch device 114 to couple the output 116 with the internal voltage rail. When operating in the hibernate mode, the digital logic 112 controls the switch device to disconnect the output 116 from the internal voltage rail, which results in a floating condition at its output 116. The output 116 of the switch device 114 provide an output of the battery protector 100 that can be connected to a hibernate input of another battery protector. By this connection, the digital logic 112 of one battery protector 100 can control the switch device 114 to communicate a command to another battery protector to enter and exit its hibernate mode and active mode.

The digital logic 112 can also control power that is provided other battery protection circuitry based on whether the battery protector is operating in the hibernate mode or active mode. The other circuitry can include gate core logic, protection circuitry, and housekeeping functions. For example, the digital logic 112 can disconnect such other battery protection circuitry from a source of electrical power when operating in the hibernate mode and enable power to such circuitry in the active mode. However, regardless of whether the battery protector in operating in the hibernate or active mode, power is supplied to the analog frontend circuitry 110 and associated digital logic 112 to enable exit from the hibernate mode in response to a change in the state of the hibernate mode input terminal 108.

As a further example, to eliminate erroneous (e.g., early) entry into and/or exit from the hibernate mode, the analog frontend circuitry 110 can implement one or more corresponding filters with different deglitch time intervals. In an example, the time that the analog frontend circuitry 110 needs to detect a transition from the connected to floating condition (e.g., entry into hibernate mode) at the terminal 108 can be greater than the time utilized to determine a transition from the floating to the connected condition (e.g., exit from the hibernate mode to the active mode). The deglitch filtering thus can be utilized to validate transitions in the output of the analog front end circuitry 110 based on the signal at the hibernate mode input 108.

Figure 2:
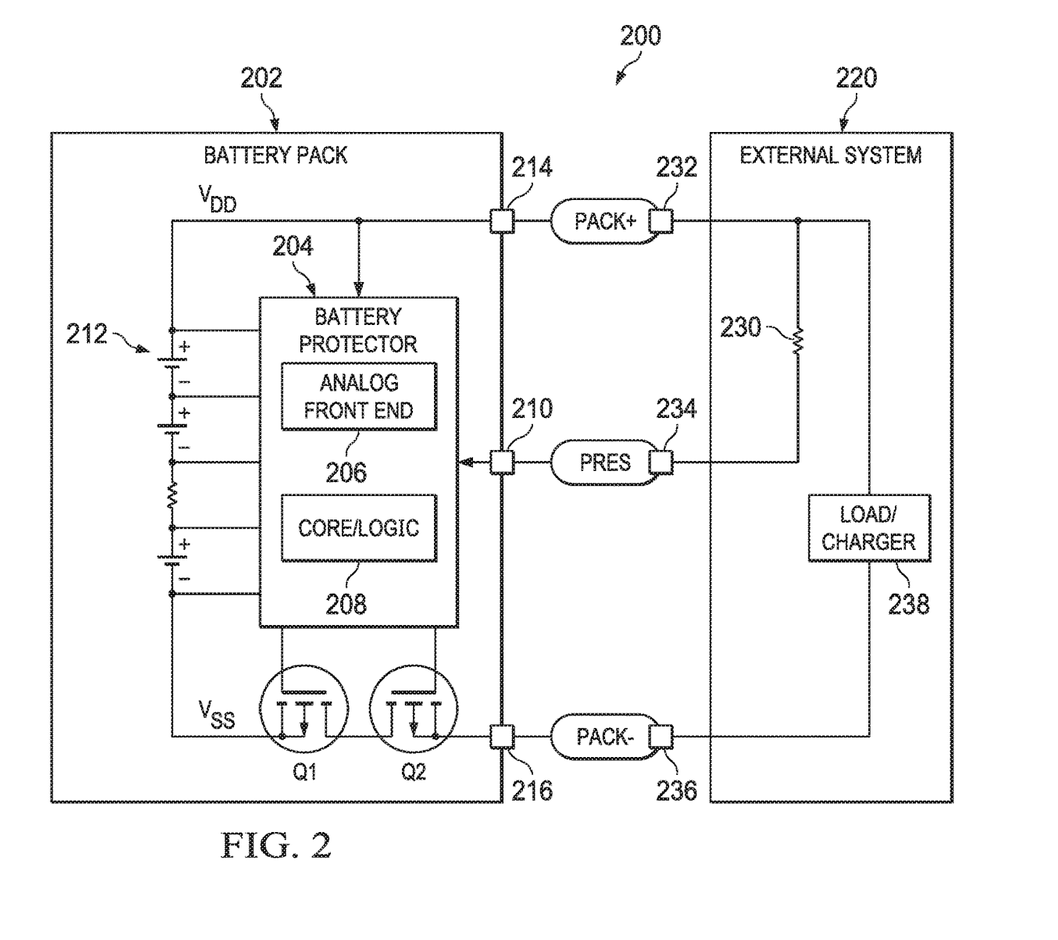
FIG. 2 depicts an example of a battery system in which a battery pack that includes a battery protector is attached to a load or charger.
Figure 3:
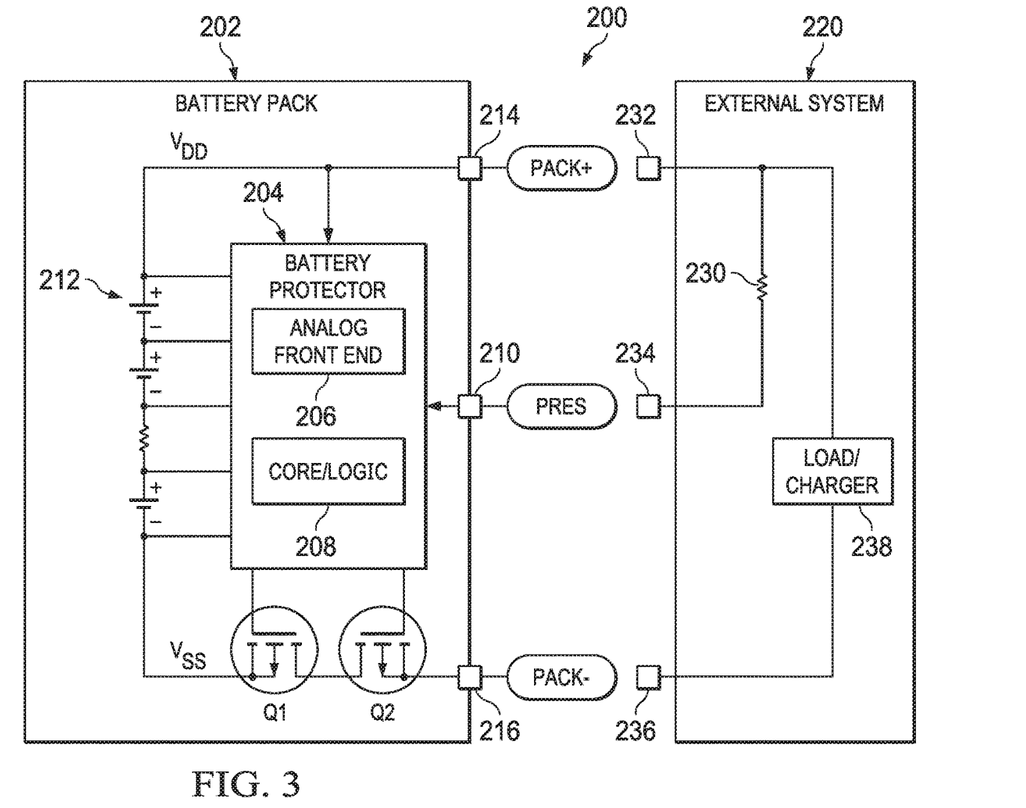
FIG. 3 depicts an example of a battery system in which a battery pack including a battery protector is disconnected from a load or charger.

FIGS. 2 and 3 illustrate an example of a battery system 200 in the connected condition (FIG. 2) and a disconnected condition (FIG. 3). Like reference characters are used to refer to common features in FIGS. 2 and 3. The battery system 200 includes a battery pack 202 that includes one or more battery protectors 204. For example, the battery protector 204 can correspond to the battery protector 100 of FIG. 1. For example, each battery protector 204 can be implemented as an integrated circuit chip that includes a combination of analog and/or digital circuitry configured to perform the functions disclosed herein.

In the example of FIGS. 2 and 3, the battery protector 204 includes analog frontend circuitry 206 and core/logic circuitry 208. As an example, the core/logic circuitry 208 includes logic and control circuitry configured to monitor temperature for over and under temperature condition, monitor cell voltages for overvoltage and/or undervoltage conditions, and monitor charging and discharging currents for over current and/or short circuit conditions. Non-volatile memory within the core/logic circuitry 208 can store user-programmable protection thresholds and delay times. In some examples, the core/logic circuitry 208 can be configured to output a fault output signal in response to determining one of these thresholds has been exceeded as part of battery protection functionality. The core/logic circuitry 208 can also be configured to perform cell balancing and control other functions, such as charging and discharging a plurality of batteries cells 212 that are connected in the battery pack 202.

The analog frontend 206 is configured to monitor a signal at a hibernate mode input terminal 210 and, based upon the signal at such input terminal, generate an output that is used to control entry into and exit from the hibernate mode. For example, the core/logic circuitry 208 can receive the output from the analog frontend circuitry 206 to control the operating mode of the battery protector 204 as well as to disconnect power being supplied to selected core/logic circuitry during the hibernate mode. During the hibernate mode, the battery protector 204 continues to supply power to the analog frontend circuitry 206 and to associated portions of the core/logic circuitry 208 (e.g., digital logic 112) 208 as to enable a transition from the hibernate mode back to the active mode. As an example, in hibernate mode, the battery protector 204 may draw a maximum current up to about 2.0 µA (compared to about 8-13 µA during the normal active mode).

In the example of FIG. 2, the terminals of each battery cell 212 are connected to the battery protector 204 such as for monitoring the cell voltage across each battery cell and implementing various cell balancing and other operations. In this example, the battery protector 204 is also connected to high and low voltage rails of the battery pack 202, demonstrated at $V_{DD}$ and $V_{SS}$. The battery pack 202 also includes terminals 214 and 216, which are coupled to connector terminals PACK+ and PACK. For example, the PACK+ connector terminal is connected to the high rail terminal 214 and the PACK− connector terminal is coupled to the low rail terminal 216. Similarly, a presence (PRES) connector is coupled to the hibernate mode input terminal 210 to supply a signal that the battery protector monitors to detect the presence (or absence) of the external system 220. The external system 220 may be connected to and disconnected from the battery pack 202 via physical connections at the PACK+ and PACK− connectors as well as the PRES connector.

In this example, the external system 220 includes a resistor 230 connected between terminals 232 and 234. In this way, when the external system 220 is connected to the battery pack, as shown in FIG. 2, the hibernate mode terminal 210 is connected to $V_{DD}$ through the PRES connector terminal, terminal 234, the resistor 230, terminal 232, the PACK+ connector terminal, and terminal 214. The external system 220 also includes a load and/or charger (shown as load/charger) 238 that is connected between terminals 232 and 236. The load/charger 238 thus can draw current as a load that is connected and utilize the power stored in the battery pack 202. Alternatively or additionally, the load/charger 238 can operate as a charger to supply electrical power to the battery pack 202.

By way of further example, when the external system 220 is attached, as shown in the example of FIG. 2, the PRES connector couples the hibernate mode terminal 210 with the high voltage rail $V_{DD}$, corresponding to a connected condition. As used herein, the connected condition refers to a configuration of the battery pack 202 in which the external system 220 is coupled to the battery pack 202 as to provide the high voltage rail or other high voltage at the hibernate mode terminal 210. In contrast, the floating (e.g., low voltage) condition exists at the hibernate mode terminal 210 in response to the external system being disconnected from the battery pack 202, such as shown in FIG. 3. As shown in FIG. 3, terminals 232, 234, and 236 are electrically disconnected (isolated) from the PACK+, PRES and PACK− connectors, respectively. Thus, in response to disconnecting the external system 220 from the battery pack 202 the hibernate mode terminal 210 is in a floating condition. As used herein, the floating condition at the hibernate mode terminal 210 corresponds to a configuration in which the hibernate mode terminal 210 is electrically disconnected from the high voltage rail $V_{DD}$ (e.g., the external system provides no connection between the PACK+ connector and the PRES connector). Additionally, the floating condition also removes an external ground connection from the battery pack 202. When the external system is disconnected from the battery pack, any communication lines between the external system 220 and the battery pack 202 are also disconnected.

FIGS. 2 and 3 also depict transistors Q1 and Q2 connected in series between terminal 215 and the low voltage rail $V_{SS}$. For example, the transistor Q1 is a discharge capacitor that is selectively activated by core/logic circuitry 208 to selectively discharge battery cells 212. Transistor Q2 is controlled by core/logic circuitry 208 to charge the battery cells 212. Charge and discharge operations also depend on whether the external system 220 is connected with a battery pack as well as the type of external system, namely, whether it is a load or charger type system. In some examples, the external system 220 can include a system control switch coupled between terminals 232 and 234 to selectively connect terminals 232 and 234. This connection can be implemented in response to connecting the external system 220 with the battery pack or after certain conditions have been met following such connection or disconnection between the battery pack and external system.

Figure 4:
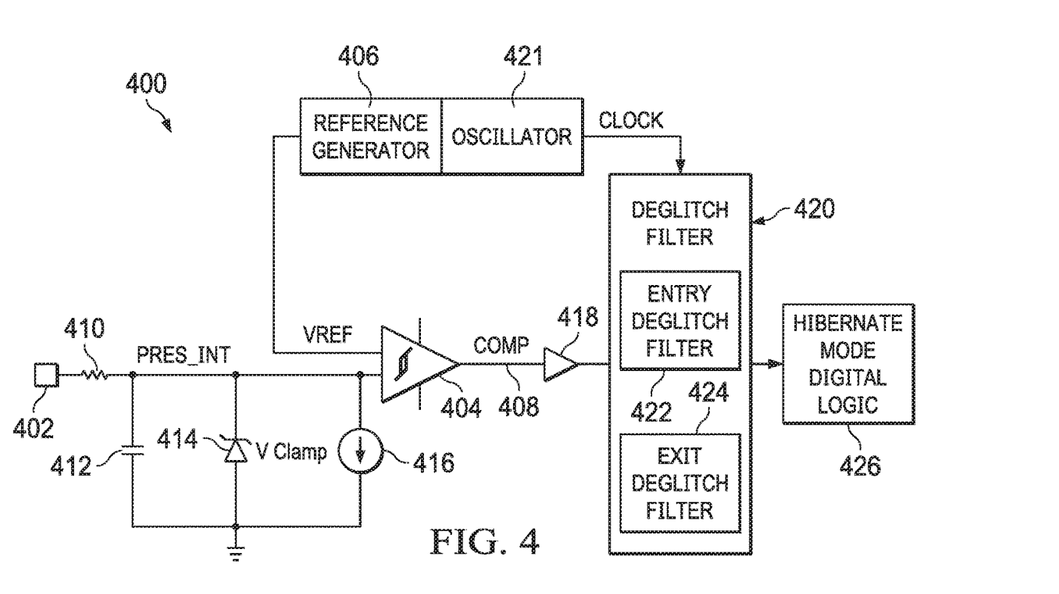
FIG. 4 depicts an example of analog frontend circuitry of a battery protector.

FIG. 4 depicts an example of analog frontend circuitry 400, such as analog frontend circuitry 110 or 206 that can be implemented in a battery protector as disclosed herein. Analog frontend circuitry 400 is coupled to a hibernate mode input terminal 402. The analog frontend circuitry 400 remains active regardless of whether an external system, including a load/charger, is connected with a battery pack in which the analog frontend circuitry 400 is implemented. The analog frontend circuitry 400 is configured to operate with ultra low power requirements to mitigate self discharge for the arrangement of battery cells in the battery pack.

The analog frontend circuitry 400 includes a comparator 404 configured to compare the signal at the terminal 402 with respect to a reference voltage (VREF). For example, the comparator 404 is a hysteresis comparator. The reference voltage VREF is generated by a low power reference generator 406. For example, the reference generator 406 may be implemented as a low dropout (LDO) regulator. The comparator 404 thus compares the signal at terminal 402 with the reference voltage to provide a corresponding comparator signal at output 408. In some examples, protection circuitry, such as including resistor 410, capacitor 412 and Zener diode 414, may be connected between the terminal 402 and the input of the comparator 404. Such protection circuitry can mitigate spikes at the input, such as may occur when connecting and disconnecting from the PACK+ and PACK− and PRES connector terminals.

Additionally, a weak pull down circuit 416 can be coupled to the input of the comparator 404. For example, the pull down circuit 416 is a current source configured to pull current from the comparator input, which is coupled to terminal 402, to internal ground of the battery protector. Thus, while the terminal 402 is floating (e.g., when the associated battery pack is disconnected from the external system), the pull down circuit causes the corresponding hibernate input terminal 402 to go to zero volts. The comparator 404 is configured to resolve the state of the terminal 402 and provide a corresponding comparator output COMP. For example, when the hibernate mode terminal 402 is connected with the high rail (e.g., through a connection in the external system), the voltage is greater than the reference voltage VREF. Accordingly, the comparator output 408 is de-asserted to provide a low voltage signal at comparator output COMP (e.g., corresponding to logic 0). In circumstances when the input terminal 402 is floating, such as when disconnected from the external system, the pull down circuit 416 pulls the corresponding comparator input to zero volts, which is lower than the reference voltage VREF. In response, the comparator output at 408 is asserted to provide a high comparator output COMP (corresponding to logic 1). In this way, the comparator output COMP indicates whether the battery protector should be operating in the hibernate mode or the active mode.

The circuitry 400 also includes a deglitch filter 420. A buffer 418 can be connected between the comparator output 408 and an input of the deglitch filter. The buffer 418 can increase the driving capability of the output of comparator 404 to facilitate processing by the deglitch filter 420. The deglitch filter 420 can be implemented as a digital filter configured to validate that transitions in the comparator output 408 accurately represents state changes at the hibernate mode terminal 402. The deglitch filter 420 is configured to apply different time intervals for filtering the comparator output COMP depending upon whether the transition at the hibernate mode terminal is from low to high (e.g., from disconnected to connected) or from high to low (e.g., from connected to disconnected). To control the deglitch time intervals, a low power oscillator 421 provides a corresponding clock signal to the deglitch filter 420. For example, the deglitch filter 420 implements a timer to monitor transitions to ensure that the transition at the comparator output 408 corresponds to an actual change in the state of the terminal 402 rather than a glitch, such as may occur due to switch turning on and off or through any other source.

For example, the deglitch filter 420 is implemented as a digital filter that includes an entry deglitch filter 422 and an exit deglitch filter 424. The application of the entry or exit deglitch filter depends on the current mode of the battery protector. The entry deglitch filter 422 is configured to remove glitches at the comparator output 408 of duration that are less than a predetermined duration (e.g., about four to five seconds) for validating transitions from the active mode to the hibernate mode. The exit deglitch filter 424 is configured to remove glitches at the comparator output 408 of another predetermined duration that is less than the entry deglitch filter 422 when transitioning from the active mode to the hibernate mode. For example, the exit deglitch filter 424 can remove glitches at the comparator output 408 that are less than one second (e.g., about 10 milliseconds) for validating transitions from the hibernate to the active mode. In one example, both filters 422 and 424 may remain active and the current state of hibernate mode input can be used to control which deglitch filtering output to utilize as the filtered output. In another example, the current state of the battery protector can be used to control which filter 422 or 424 is active to supply the filtered output signal. The deglitch filter 420 is coupled to provide the filtered output signal to digital logic 426.

Digital logic 426 can control the operating mode of the system, namely, to transition a battery protector from the active mode to the hibernate mode or, alternatively, from the hibernate mode to the active mode, in response to the filtered signal provided by deglitch filter 420. The comparator output at 408 can provide its output at logic one or zero to the input of the digital deglitch filter 420. In other examples, the deglitch filter may be implemented as an analog circuit with a corresponding analog to digital converter at its output. By implementing the deglitch filter 420 for entry and exit as mentioned above, and by utilizing the hysteresis comparator 404, the likelihood of erroneous entry into the hibernate mode is reduced or eliminated. Additionally, the shorter duration for the exit deglitch filtering can help ensure fast wake up in response to being connected to a load or charger.

Figure 5:
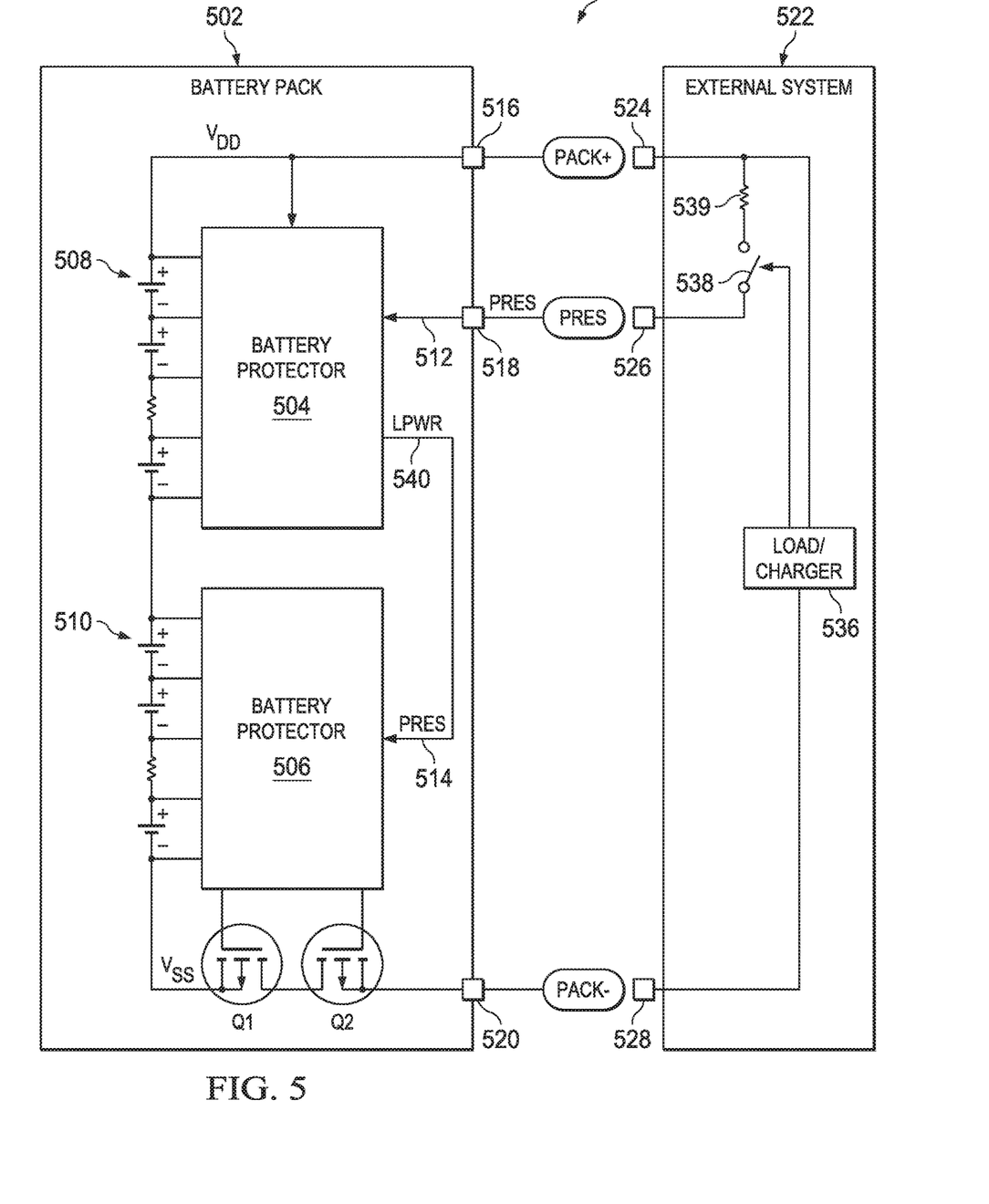
FIG. 5 depicts an example of a battery system that includes a plurality of battery protectors.

FIG. 5 depicts an example of a battery pack 502 that includes a plurality of battery protectors 504 and 506. Each of the battery protectors 504 and 506 can be configured as discussed above with respect to the examples of FIGS. 1-4, including analog frontend circuitry and associated logic and core/logic circuitry for implementing protection and battery management functions. In the example of FIG. 5, a plurality of battery cells 508 are connected to the battery protector 504 and another set of battery cells 510 are connected to battery protector 506. Each of the battery protectors 504 and 506 may be implemented as separate integrated circuit chips, each including a corresponding hibernate mode input terminals 512 and 514 respectively.

The battery pack 502 includes terminals 516, 518 and 520 that can be coupled with an external system 522. For example, the external system 522 includes corresponding connector terminals 524, 526 and 528 that are configured to couple with respective connectors PACK+, PACK− and PRES of the battery pack 502. The external system 522 may be implemented to include a load and/or charger 536 that can be configured to draw electrical energy from the battery pack 502 or to supply energy to the battery pack for charging. The load/charger 536 can also control an internal switch that can electrically couple terminal 526 with terminal 524.

A switch device 538 can be connected between terminals 524 and 526 and control by logic of the load/charger 536. The switch device 538 may be implemented as a mechanical switch, solid state relay or any other type of switch device. The switch device 538 can selectively electrically connect the terminals 524 and 526 through a resistor 539. For example, when the external system 522 is coupled with the battery pack 502, the switch device 538 is closed to electrically couple hibernate mode terminal 512 to the high voltage rail $V_{DD}$ through the connectors PRES and PACK+. Similarly, terminal 520 can be coupled to the low voltage rail $V_{SS}$ through corresponding transistor devices Q1 and Q2. Transistor devices Q1 and Q2 thus can control, charge and discharge respectively of the battery cells 508 and 510 based on control signals from battery protector 506 and associated circuitry of battery protector 506.

In the example of FIG. 5, battery protector 504 includes a low power output 540 that is coupled to the hibernate mode input terminal (PRES) 514 of the next battery protector 506. As explained above, hibernate mode digital logic (e.g., 112, 208, 426) of the battery protector 504 can control the signal at its output 540 based on the state of its hibernate mode input 512. By way of example, in response to connecting the external system 522 to the battery pack 502 (e.g., by electrically coupling terminals 516 and 524, 518 and 526, and 520 and 528), the hibernate mode input 512 of that protector 504 will be pulled high, namely to the high voltage rail $V_{DD}$. Corresponding analog frontend circuitry and digital logic, as disclosed herein, will control the battery protector 504 to provide a high voltage at the low power output 540 (e.g., in response to closing internal switch between 540 and an internal reference of battery protector 504) indicating protector 504 is operating in the active mode. The corresponding signal LPWR at 540 is communicated internally within battery pack 502 from the battery protector 504 to the hibernate mode input 514 of battery protector 506.

The internal connection in the battery pack 502 between protectors 504 and 506 thus is utilized to communicate from protector 504 to protector 506 which operating mode the battery protector 504 is operating. A similar internal connection can be used to communicate operating state information from the protector 506 to another battery protector (not shown) if more than two battery protectors are implemented in battery pack 502. The internal connection (e.g., an inter-chip communication link) may be a wire, trace or other communication link within the battery pack 502 (e.g., optical or electrically conductive link) to communicate mode changes from one protector 504 to another. For example, battery protector 504 includes a switch device (e.g., switch 114) that is controlled by mode logic determining whether the battery protector 504 is in the active mode or in the hibernate mode. For example, digital logic can close the switch when the battery protector 504 is in the active mode thereby causing the low power output at 540 to couple to a high voltage (e.g., $V_{DD}$ or another internal voltage of battery protector 504) and provide a corresponding high voltage to the hibernate mode terminal 514 of the next battery protector 506 (e.g., located lower in the battery pack stack). In response to the signal at its hibernate mode terminal 514, battery protector 506 will, in turn, operate in the active mode in response to the signal at 540.

Similarly, in response to the hibernate mode input terminal 512 of the battery protector 504 being in a floating condition (responsive to disconnecting external system 522 from battery pack 502), the analog frontend circuitry and logic can detect such floating condition, such as corresponding to a transition from the active to hibernate mode. In response, digital logic can control the switch device of the battery protector 504 to disconnect the low power output at 540 from the internal supply voltage and thereby cause the hibernate mode input 514 to likewise change to floating via the internal connection. In response to detecting the floating condition at terminal 514, analog frontend circuitry and logic of the battery protector 506 will cause the battery protector 506 to transition from the active mode to the hibernate mode.

As a result, where the plurality of battery protectors are utilized in a stacked arrangement that includes battery cells connected between $V_{DD}$ and $V_{SS}$, such as shown in FIG. 5, no additional external pins are required for the battery pack 502. Additionally while the battery pack 502 in the example of FIG. 5 is shown with two battery protectors 504 and 506 there can be any number of battery protectors. Thus, in examples where more than two battery protectors are included in the battery pack, each preceding battery protector in the stack has its low power output coupled to the hibernate mode input of the next (e.g., lower) battery protector via an internal connection of the battery pack.

Figure 6:
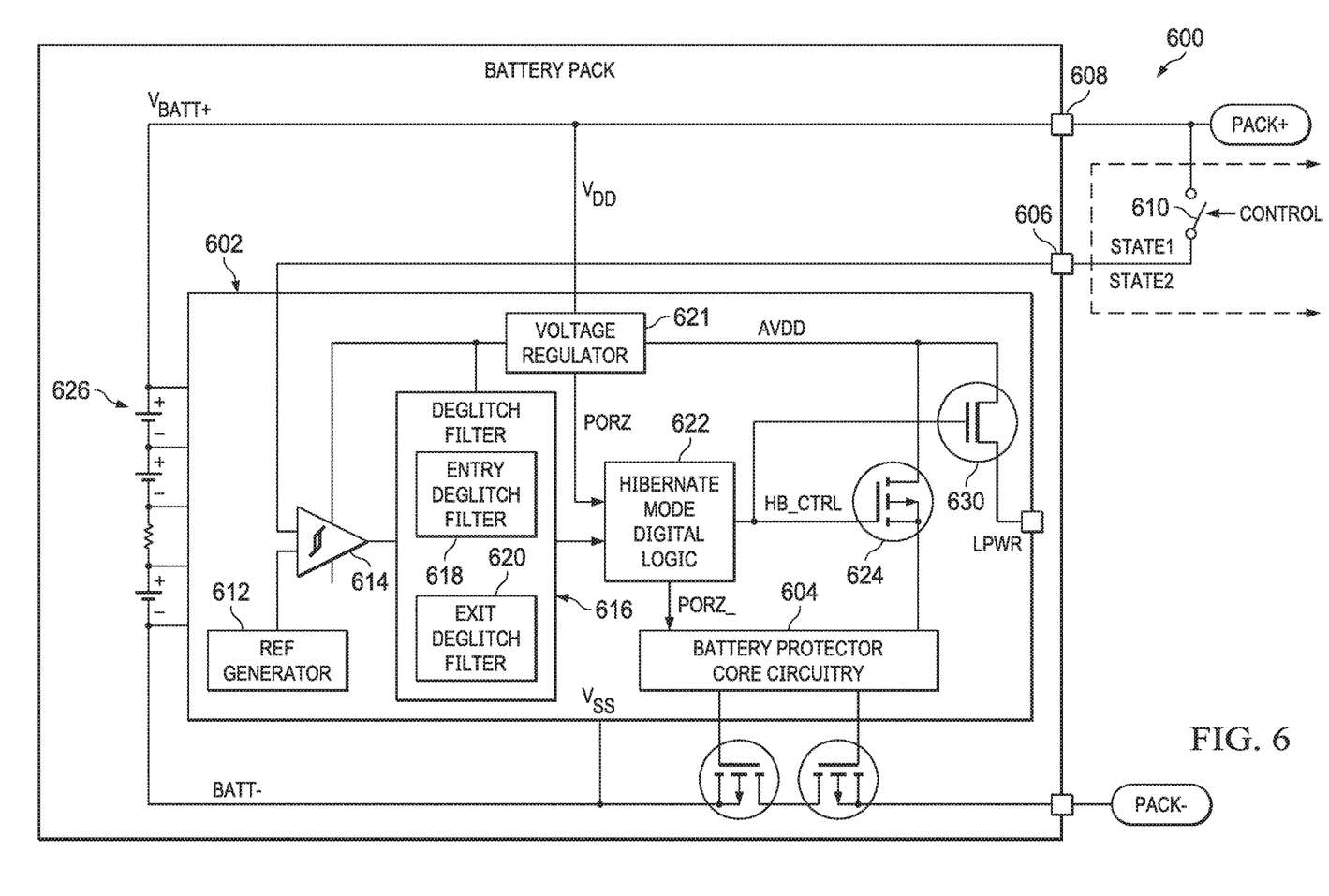
FIG. 6 depicts an example of a battery system including a battery protector configure to gate power to core circuitry.

FIG. 6 depicts another example of battery pack 600 demonstrating how hibernate mode control can be utilized to gate battery protector core circuitry 604. In this example, the battery pack 600 includes a battery protector 602 that is coupled to a hibernate mode input 606. As disclosed herein, there can be any number of similarly configured battery protectors 602 in the pack 600, each constituting a separate integrated circuit chip. As shown in FIG. 6, the hibernate mode terminal 606 is selectively coupled to a high voltage rail (e.g., corresponding to $V_{BATT+}$) in response to activating a switch 610 to electrically couple terminal 606 to terminal 608 corresponding to PACK+ input terminal. For example, switch 610 can be controlled by an external system to which the PACK+ and PACK− connectors are coupled. In this way, the external system can control the state of the input at 606, and the state of the input used to control entry into and exit from the hibernate mode when connected to the battery pack 600.

In this example, the analog frontend circuitry is configured similarly as disclosed herein (see, e.g., FIG. 4). Briefly stated, the analog frontend circuitry includes a reference generator (e.g., a low power circuit like and LDO) 612 to provide a reference voltage to an input of a comparator 614. The other input of the comparator 614 is coupled to terminal 606 to receive the signal provided at the hibernate mode input. The comparator 614 provides a comparator output that varies based on the signal at terminal 606. The comparator 614 provides the comparator output to a deglitch filter 616, which is configured to implement an entry deglitch filter 618 and exit deglitch filter 620, such as disclosed herein. The deglitch filter 616 provides a deglitched output (e.g., a digital signal) to hibernate mode digital logic 622.

Hibernate mode logic 622 can provide a hibernate control signal (HB_CTRL) to a switch device 624 that is coupled between an internal regulated voltage (AVDD) and a power input of the core circuitry 604. Thus, the analog frontend and logic 622 can control the switch device 624 to gate the power signal that is applied to the core circuitry 604 depending on whether the protector 602 is in the active mode or the hibernate mode. For example, in the active mode, the hibernate mode logic 622 activates switch device 624 to couple AVDD to the input of the core circuitry 604 to supply electrical power and thereby enable corresponding functionality of the core circuitry. In the hibernate mode, logic 622 deactivates the switch device 624 and thereby disconnects AVDD from the power input of the core circuitry 604.

As a further example, the logic 622 can also provide the control signal (or an inverted version thereof) to another switch device 630 that is connected between the internal rail AVDD and a low power output terminal LPWR of the battery protector 602. As disclosed herein, the LPWR output terminal LPWR can be connected to provide a corresponding internal battery pack communication link to a hibernate mode input of another battery protector within the battery pack. The signal at the LPWR output terminal LPWR thus can vary based on the operating mode of the battery protector 602 determined by the mode logic 622. The hibernate mode digital logic 622 can also provide an internal power on reset (PORZ) signal to the battery protector core circuitry 604, such as in conjunction with transitioning from the hibernate to the active mode. The PORZ signal thus can help facilitate activation of corresponding circuitry for operating in the normal active mode.

Figure 7:
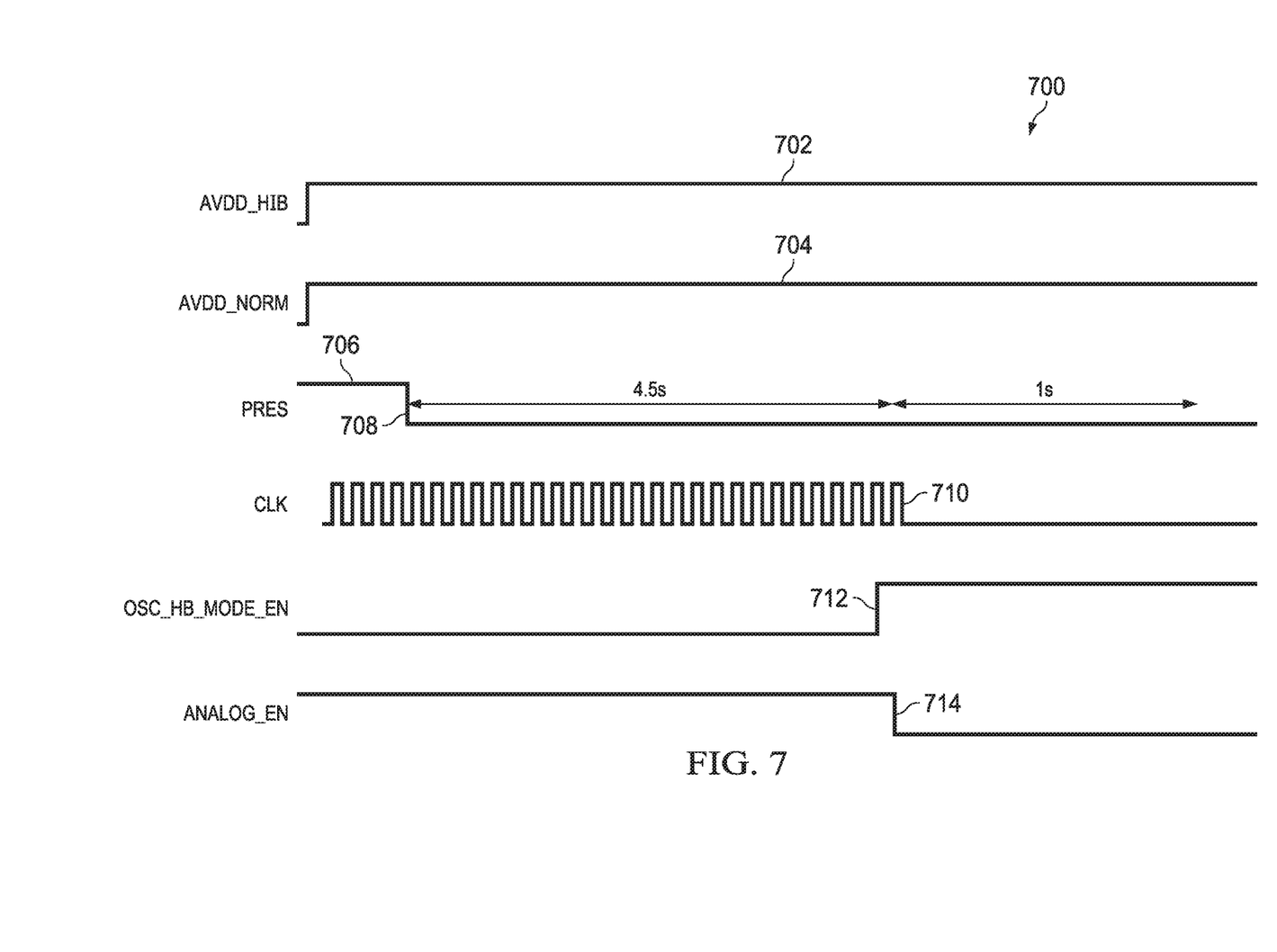
FIG. 7 is an example of a timing diagram demonstrating signals associated with entry into a hibernate mode.
Figure 8:
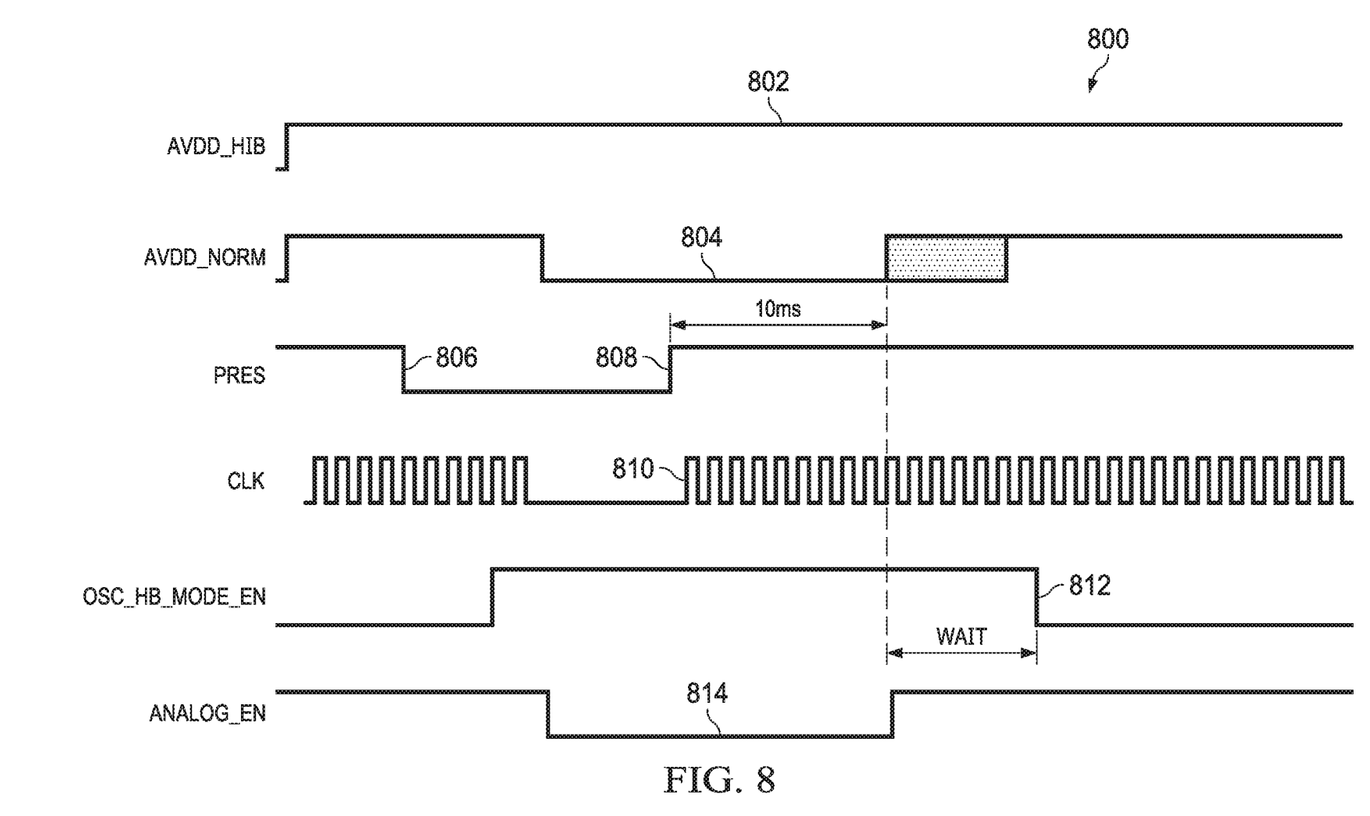
FIG. 8 depicts an example of another timing diagram demonstrating signals associated with exit of a hibernate mode.

FIGS. 7 and 8 illustrate timing diagrams 700, 800 showing states of various signals in the battery protector (e.g., 100, 204, 504, 506, 602) associated with transitions between the active mode and the hibernate mode. In the example of entry into the hibernate mode of FIG. 7, signal 702 corresponds to an always on voltage rail AVDD_HIB that is supplied to analog frontend circuitry and hibernate mode logic. Signal 704 is an always on internal power signal that is supplied to the rest of the battery protector. In this example, a presence signal (PRES) 706 corresponds to the signal at a hibernate mode input terminal. The PRES signal 706 is shown to transition from a high to low state at 708, such as in response to disconnecting an external system from a battery pack. A clock signal 710 (e.g., from oscillator 422) is used by the deglitch filter to impose a predetermined deglitch time interval, such as several seconds (e.g., about 3-6 seconds) before entering the hibernate mode from the active mode. The wait time can be controlled by deglitch filter (e.g., 420, 616), as disclosed herein. After the predetermined wait period, mode logic asserts a logic signal (OSC_HB_MODE_EN) 712 to enable the hibernate mode for the battery protector. Additionally, an analog enable signal (ANALOG_EN) 714 is de-asserted from its normally-on state to disable the oscillator and remaining analog and digital circuitry of the battery protector.

In the example of FIG. 8, the same signals are shown but for demonstrating exit from the hibernate mode and entry into the active mode. Thus, the voltage rail AVDD_HIB 802 remains in a high state to supply power to the analog frontend and associated logic. Signal 804 corresponds to an internal voltage rail that supplies power to the rest of the battery protector circuitry. In this example, the presence signal (PRES) 806 transitions from a low state (in the hibernate mode) to a high state, demonstrated at 808. This transition 808 in the PRES signal 806 is used to activate the oscillator to supply clock signal 810 (e.g., from oscillator 422) that is used by the deglitch filter to impose a predetermined deglitch time interval, such as less than one second (e.g., 10 ms) before implementing the exit from the hibernate mode. After the deglitch wait time, mode logic re-activates the internal voltage rail 804 to supply power to the rest of the battery protector circuit. The analog enable signal (ANALOG_EN) 814 is also asserted to its normally-on state to enable remaining analog and digital circuitry of the battery protector. Finally, after waiting a predetermined wait time after the deglitch interval, the logic signal (OSC_HB_MODE_EN) 812 is de-asserted to complete the exit from the hibernate mode and enter the active mode for the battery protector.

Figure 9:
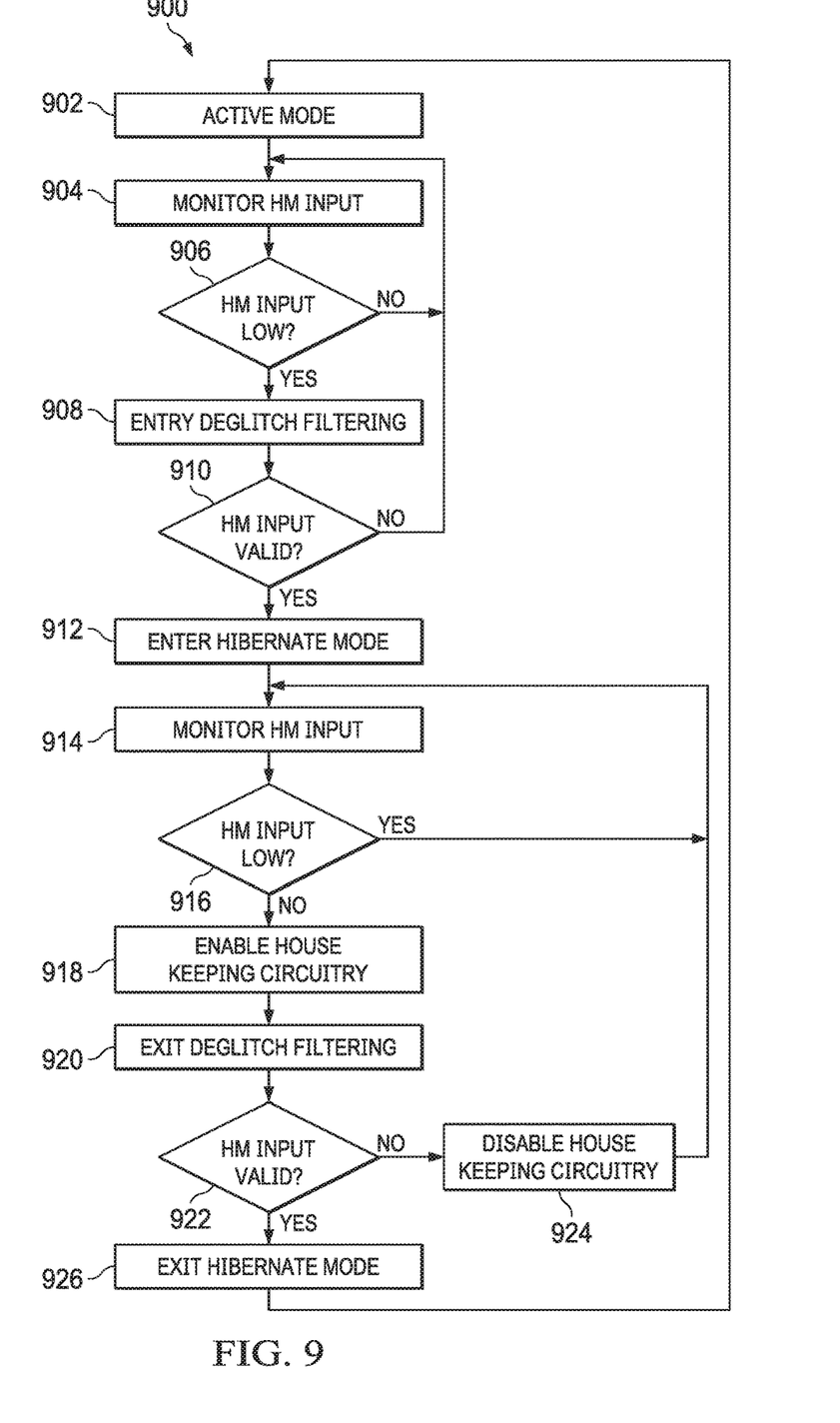
FIG. 9 is a flow diagram illustrating the example method to enter and exit a hibernate mode.

In view of the structural and functional features described above, a method will be better appreciated with reference to FIG. 9. It is to be understood and appreciated that the illustrated actions may occur in different orders or concurrently from that shown. Moreover, not all features illustrated in FIG. 9 may be required to implement the method. It is to be further understood that the following method can be implemented in hardware (e.g., by a battery protector, including analog and digital circuit components), which may be implemented in an IC chip.

FIG. 9 depicts an example method 900 demonstrating entry and exit of a hibernate mode for a battery protector (e.g., protector 100, 204, 504, 506, 602). In this example, the method 900 begins in the active mode at 902. Thus, circuitry is enabled and operating in a normal manner. This may include cell balancing and fault protection functions. At 904, a hibernate mode (HM) input is monitored. For example, the hibernate mode input terminal of protection circuitry receives either a high voltage signal of a battery pack in response to an external system (e.g., load and/or charger) being connected or a floating condition signal in response to the external system (e.g., load and/or charger) being disconnected. The HM input may be sampled periodically. As disclosed herein, analog frontend circuitry includes a comparator to compare the signal at the hibernate mode input signal to a reference signal. At 906, a determination is made whether the HM input is low. If the HM input is not low (NO), corresponding to the HM input remaining at a high voltage (e.g., in response to the external system being connected to the battery pack), the method returns to 904 to continue monitoring the HM input. In response to detecting that the HM input has gone low, the method proceeds to 908.

At 908, HM entry deglitch filtering is applied to ensure that the low voltage is in fact a low voltage condition for which it is desirable to enter the hibernate mode. Based on the filtering at 908, a determination is made whether the HM input that was detected is valid. If the HM input is not valid (e.g., it did not remain low for the predetermined wait time period determined by deglitch filtering at 908), the method returns to 904 to continue monitoring the HM input. If the HM input is validated at 910 (e.g., the HM input remained low for at least the deglitch wait time period), the method proceeds to 912. At 912, the battery protector enters the hibernate mode. In the hibernate mode, communication to another battery protector (if any) is enabled (e.g., via a low power output terminal coupled with a HM input terminal of the other battery protector). Additionally, other processing blocks of the battery protector are disabled to provide for low power operation during the hibernate mode.

In the hibernate mode, the HM input is monitored at 914. Then, at 916, a determination is made whether the HM is low. If the HM input is low, the method returns to 914 to continue the monitoring (e.g., by periodically sampling the HM input). In response to determining that the HM input is not low (e.g., a high voltage is detected at the HM input), the method proceeds to 918. At 918, housekeeping circuitry is enabled to facilitate possible transition to the active mode.

At 920, HM exit deglitch filtering is applied to ensure that the HM input voltage is in fact a high voltage condition for which it is desirable to exit the hibernate mode. The filtering at 920 imposes a wait period (e.g., about 10 ms), which is less than the period (e.g., about 4-6 s) at 908 as to provide for exiting the hibernate mode more quickly than entering into the hibernate mode. Based on the filtering at 920, a determination is made whether the HM input that was detected is valid. If the HM input is not valid (e.g., it did not remain high for at least the predetermined wait time period), the method proceeds to 924 to disable the housekeeping circuitry that was enabled at 918. From 924, the method returns to 914 to continue monitoring the HM input and remain in the hibernate mode. If the HM input is validated at 922 (e.g., the HM input remained high for at least the deglitch wait time period), the method proceeds to 926. At 926, the battery protector exits the hibernate mode. From 926, the method returns to 902 to enter the active mode. Additionally, stack communication (e.g., via its low power output to the HM input of another battery protector) specifies the change to transition from the hibernate to the active mode. For example, the low power output can be set to the high state (e.g., coupled to the internal high voltage rail of the battery protector, which is presented at the HM input of the other battery protector).

Thus the method 900 is able to distinguish between connected and floating conditions for the battery protector in the absence of an external ground connection for the protection circuitry as well as without any communication from the external system. Moreover, as multiple battery protectors are implemented in a given battery pack, internal communication between protectors facilitates entry into and exit from the hibernate mode without further external connections for each protector. As a result, each battery protector is adapted to enter into the hibernate mode when not in use and thereby limit self-discharge of battery pack.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. Additionally, where the disclosure or claims recite "a," "an," "a first," or "another" element, or the equivalent thereof, it should be interpreted to include one or more than one such element, neither requiring nor excluding two or more such elements.

What is claimed is:

1. A battery protector circuit, comprising:
    a VDD input terminal, a VSS input terminal, a hibernate mode input terminal, a first transistor gate output terminal, a second transistor gate output terminal, and a low power output terminal;
    analog frontend circuitry having an input coupled to the hibernate input terminal separate from the VDD input terminal and having a filtered output; and
    digital logic having an input coupled with the filtered output and having an output coupled with the low power output terminal.

2. The battery protector circuit of claim 1, in which the digital logic provides a signal at the low power output that is pulled up to an internal high voltage rail of the battery protector circuit while the battery protector operates in the active mode and is floating while the battery protector operates in the hibernate mode.

3. The battery protector circuit of claim 1, in which the analog frontend circuitry includes a comparator to compare the signal at the hibernate mode input terminal with a reference signal and to provide the filtered signal at the output of the analog frontend circuitry that varies based on the comparison.

4. The battery protector circuit of claim 3, in which the analog frontend circuitry includes deglitch circuitry configured to remove glitches in the signal at the output of the analog frontend circuitry and thereby reduce erroneously detecting changes between the connected and floating conditions.

5. The battery protector circuit of claim 4, in which the deglitch circuitry includes:
    a first deglitch filter configured to analyze the signal at the output of the analog frontend circuitry over a first time period to validate a change from the connected condition to the floating condition; and
    a second deglitch filter configured to analyze the signal at the output of the analog frontend circuitry over a second time period to validate a change from the floating to the connected condition, the first time period being greater than the second time period.

6. The battery protector circuit of claim 4, including an oscillator circuit to provide a clock signal to the deglitch circuitry regardless of whether the battery protector is operating in the active mode or the hibernate mode.

7. The battery protector circuit of claim 1, including:
    a battery pack having battery cells coupled between the VDD input terminal and the VSS input terminal; and
    first and second transistors coupling the battery pack to the VSS terminal and having respective gates coupled to the first and second transistor gate output terminals.

8. The battery protector circuit of claim 7, in which the battery protector circuit is a first battery protector circuit, the system including a second battery protector,
    a first portion of the battery cells is associated with the first battery protector circuit and a second portion of the battery cells are associated with the second battery protector circuit,
    the first battery protector circuit includes the hibernate mode input terminal, a hibernate mode input terminal of the second battery protector being coupled with the low power output of the first battery protector circuit.

9. The battery protector circuit of claim 8, in which each of the first and second battery protectors includes an instance of the analog frontend circuitry and the digital logic.

10. The battery protector circuit of claim 8, in which each of the battery protectors is implemented on a respective integrated circuit chip.

11. The battery protector circuit of claim 8, including connector terminals configured to connect to and disconnect from the hibernate mode input terminal of the first battery protector and each of the VDD input terminals and VSS input terminals of the battery pack.

12. The battery protector circuit of claim 1, in which the analog frontend circuitry includes a pull down circuitry coupled with the hibernate mode input terminal to facilitate distinguishing between the connected and floating conditions.

13. A process, comprising:
    receiving, at a hibernate mode input of a battery protector circuit separate from a VDD input, either a high voltage rail signal of a battery pack in response to a load or charger being connected or a floating signal in response to the load or charger being disconnected;

comparing the signal at the hibernate mode input to a reference signal to distinguish between connected and floating conditions for the battery protector circuit in the absence of an external ground connection for the battery protector circuit;

determining whether to operate the battery protector circuit in an active mode or hibernate mode based on the comparison; and providing a digital signal that varies based on the determination to control whether the battery protector circuit is operating in the active mode or the hibernate mode.

14. The process of claim 13, in which the battery protector circuit is a first battery protector circuit, the method including:

communicating a low power output of the first battery protector circuit to a hibernate mode input of the second battery protector circuit;

operating the second battery protector circuit in the hibernate mode based on the hibernate mode input of the second battery protector circuit having a floating state in response to the low power output of the first battery protector circuit indicating the first battery protector circuit is operating in the hibernate mode; and operating the second battery protector circuit in the active mode based on the hibernate mode input of the second battery protector circuit having a high voltage state in response to the low power output of the first battery protector circuit indicating the first battery protector circuit is operating in the active mode.

15. The process of claim 14, in which each of the first battery protector circuit and the second battery protector circuit resides within the battery pack and is coupled to a respective set of battery cells.

16. The process of claim 13, including:

providing a comparator output signal corresponding to the comparison; and filtering to remove glitches in the comparator output signal and thereby mitigate erroneously detecting changes between the connected and floating conditions.

17. The process of claim 16, in which the filtering includes:

processing the comparator output signal over a first time period to validate a change from the connected condition to the floating condition; and processing the comparator output signal over a second time period to validate a change from the floating to the connected condition, the first time period being greater than the second time period.

18. A battery system comprising:
a battery pack
including sets of battery cells connected between a high voltage rail and a low voltage rail;
battery protectors in a stacked arrangement, a respective set of the battery cells being coupled to each of the battery protectors, each of the battery protectors including:

a high voltage rail, a low voltage rail, a hibernate mode input separate from the high voltage rail, a first transistor gate output, a second transistor gate output, and a low power output;

analog frontend circuitry having an input coupled to the hibernate input terminal separate from the VDD input terminal and having a filtered output;

digital logic having an input coupled with the filtered output and having an output coupled with the low power output terminal;

in which the hibernate mode input of one of the battery protectors is configured to connect to a high voltage connector while the system is connected to an external load or charger and configured to float while the system is disconnected from the external load or charger, and in which the hibernate mode input of each other battery protector is coupled to the low power output of a respective different one of the battery protectors.

19. The system of claim 18, in which each battery protector includes a deglitch filter configured to remove glitches in the analog output signal to validate changes between connected and floating conditions at the hibernate mode input.

20. The system of claim 19, in which the deglitch filter of each battery protector includes:

a first deglitch filter configured to process the analog output signal over a first time period to validate a change from the connected condition to the floating condition; and a second deglitch filter configured to process the analog output signal over a second time period to validate a change from the floating to the connected condition, the first time period being greater than the second time period.

21. The system of claim 18, in which the battery pack includes:

a positive connector terminal coupled to the high voltage rail and configured to connect to a positive terminal of an external system;

a negative connector terminal coupled to the low voltage rail through first and second transistors, which have gates that are coupled to the first and second transistor gate outputs, and the negative connector terminal being configured to connect to a negative terminal of the external system; and a hibernate mode connector coupled to the hibernate mode input of the one battery protector.

* * * * *